United States Patent
Lin

(10) Patent No.: US 11,539,369 B2
(45) Date of Patent: Dec. 27, 2022

(54) DUTY-CYCLE CORRECTOR CIRCUIT

(71) Applicant: Taiwan Semiconductor Manufacturing Company, Ltd., Hsinchu (TW)

(72) Inventor: WeiShuo Lin, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/538,825

(22) Filed: Nov. 30, 2021

(65) Prior Publication Data

US 2022/0360266 A1    Nov. 10, 2022

Related U.S. Application Data

(60) Provisional application No. 63/185,027, filed on May 6, 2021.

(51) Int. Cl.
*H03L 7/07* (2006.01)
*H03L 7/095* (2006.01)
*H03L 7/081* (2006.01)

(52) U.S. Cl.
CPC .............. *H03L 7/07* (2013.01); *H03L 7/0816* (2013.01); *H03L 7/095* (2013.01)

(58) Field of Classification Search
CPC .......... H03L 7/07; H03L 7/0816; H03L 7/095
See application file for complete search history.

(56) References Cited

U.S. PATENT DOCUMENTS

| | | | | |
|---|---|---|---|---|
| 8,036,300 B2* | 10/2011 | Evans | .................. | H03L 7/0814 |
| | | | | 375/372 |
| 8,253,454 B2* | 8/2012 | Lin | ........................ | H03L 7/0998 |
| | | | | 375/376 |
| 9,397,868 B1* | 7/2016 | Hossain | ................ | H04L 7/0087 |
| 11,271,571 B2* | 3/2022 | Tajalli | ........................ | H03L 7/23 |
| 2009/0243679 A1* | 10/2009 | Smith | ..................... | H04N 5/126 |
| | | | | 327/158 |
| 2009/0262877 A1* | 10/2009 | Shi | ......................... | H03L 1/022 |
| | | | | 712/241 |

(Continued)

OTHER PUBLICATIONS

Chen et al., "An 8Gb/s 0.75mW/GB/s Injection-Locked Receiver with Constant Jitter Tracking Bandwidth and Accurate Quadrature Clock Generation in 40nm CMOS," 21st IEEE International Conference on Electronics, Circuits adn Systems (ICECS), pp. 9-12 (2014).

(Continued)

*Primary Examiner* — Adam D Houston
(74) *Attorney, Agent, or Firm* — Merchant & Gould P.C.

(57) ABSTRACT

A duty-cycle corrector circuit produces a clock signal with a given duty cycle (e.g., fifty percent) or with a substantially given duty cycle. The DC corrector circuit includes a delay-locked loop (DLL) circuit and a duty-cycle correction (DCC) circuit. The DLL circuit is operable to adjust a delay between local clock signals until the phase difference between the local clock signals equals or is substantially equal to zero. The DCC circuit is operable to adjust the duty cycles of the local clock signals until the duty-cycle error equals or is substantially equal to zero. The duty-cycle error equals or substantially equals zero when the duty cycles of the local clock signals equal or are substantially equal to fifty percent.

20 Claims, 15 Drawing Sheets

(56) References Cited

U.S. PATENT DOCUMENTS

| | | | | |
|---|---|---|---|---|
| 2011/0234278 | A1* | 9/2011 | Seo | H03L 7/0814 |
| | | | | 327/158 |
| 2012/0235717 | A1* | 9/2012 | Hirai | H03L 7/0891 |
| | | | | 327/156 |
| 2021/0358534 | A1* | 11/2021 | Choi | H03L 7/0816 |
| 2021/0409007 | A1* | 12/2021 | Moslehi Bajestan | |
| | | | | H03L 7/0816 |
| 2022/0140832 | A1* | 5/2022 | Song | H03L 7/0818 |
| | | | | 327/158 |

OTHER PUBLICATIONS

Lin et al., "A 70-490 MHz 50% Duty-Cycle Correction Circuit in 0.3-μm CMOS," IEEE Asian Solid-State Circuits Conference, pp. 91-94 (2006).

Patil et al., "Duty Cycle Correction Using Negative Feedback Loop an analog solution," 16th International Conference Mixed Design of Integrated Circuits and Systems, pp. 424-426 (Jun. 25-27, 2009).

* cited by examiner

DUTY-CYCLE CORRECTOR CIRCUIT

PRIORITY CLAIM AND CROSS-REFERENCE

The present application claims the benefit of U.S. Provisional Patent Application No. 63/185,027 titled "A Duty-Cycle Corrector Circuit" and filed on May 6, 2021, of which the entire disclosure is hereby incorporated by reference in its entirety.

BACKGROUND

The number of high-speed circuits and high-speed systems continues to increase. Generally, the duty cycle of a clock signal in a high-speed circuit should be at fifty percent. However, due to variations in process, voltage, and temperature (PVT), the duty cycle of the clock signal is usually above or below fifty percent. In some instances, the duty cycle may deviate greatly from fifty percent, even when the duty cycle of the clock source is at fifty percent.

Additionally, determining and applying corrections to a duty-cycle error can be challenging. For example, a traditional analog duty-cycle corrector circuit uses an analog integrator to detect the duty cycle error. However, the analog integrator can only be used in low-speed applications. A digital duty-cycle corrector circuit typically uses two delay lines to correct the accuracy. The use of the two delay lines requires a complicated circuit and results in relatively high-power consumption. For example, a comparator circuit may be used to compare the signal levels of the two delay lines. The comparator circuit is generally complex (e.g., many transistors) and consumes a large amount of area on a die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
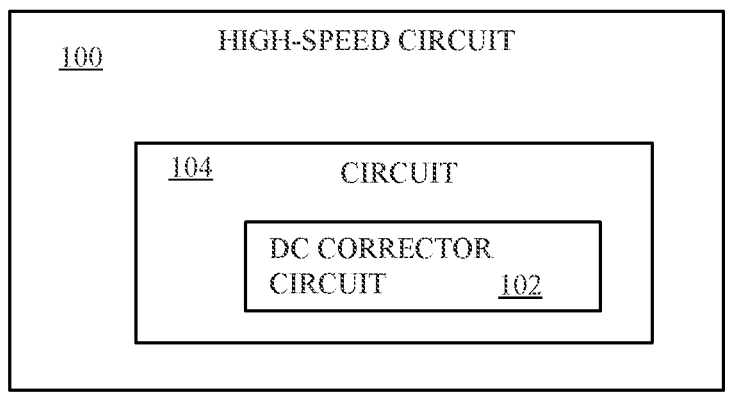
FIG. 1 illustrates a block diagram of a high-speed circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments disclosed herein provide duty-cycle (DC) corrector circuits that produce a duty cycle for a clock signal that meets a given duty cycle. In one embodiment, the given duty cycle is a fifty percent, or a substantially fifty percent, duty cycle. The DC corrector circuits utilize a delay-locked loop (DLL) circuit and a duty-cycle correction (DCC) circuit. The DLL circuit is operable to adjust a delay between two local clock signals, a delayed clock_in signal (an INP signal) and a delayed and inverted clock_in signal (an INN_d signal), until the phase difference between the local clock signals equals a given phase difference. In one embodiment, the given phase difference is zero or substantially zero. In one embodiment, the DLL circuit eventually aligns the rising edges of the local clock signals to each other. The DCC circuit is operable to adjust the duty cycles of the delayed clock_in signal and the delayed and inverted clock_in signal until the duty-cycle error equals zero (or is substantially equal to zero). The DLL and the DCC circuits produce a clock_out signal that has a fifty percent, or a substantially fifty percent, duty cycle.

Embodiments of a DC corrector circuit can be used in both low-speed and high-speed circuits and systems. The DC corrector circuit may operate on a broad frequency range of input signals and/or may accommodate a wide range of duty-cycle errors. Additionally or alternatively, embodiments of the DC corrector circuit are less complex than conventional duty-cycle corrector circuits and use less area on a die. For example, the example embodiments of the DC corrector circuits are constructed with fewer transistors than convention duty-cycle corrector circuits. In some instances, the DC corrector circuits consume less power than the conventional duty-cycle corrector circuits.

FIG. 1 illustrates a block diagram of a high-speed circuit in accordance with some embodiments. The high-speed circuit 100 can be any suitable type of a high-speed circuit, including a processing device, a memory input/output interface, and a high-frequency data converter. Example processing devices include, but are not limited to, a central processing unit, a microprocessor, and a digital signal processor. The high-speed circuit 100 typically includes multiple circuits, including a DC corrector circuit 102. In a non-limiting nonexclusive example, the DC corrector circuit 102 is implemented in a circuit 104. The circuit 104 can be any suitable circuit. Example circuits include, but are not limited to, a deskew circuit, a memory input/output interface, and/or a data converter circuit.

Figure 2:
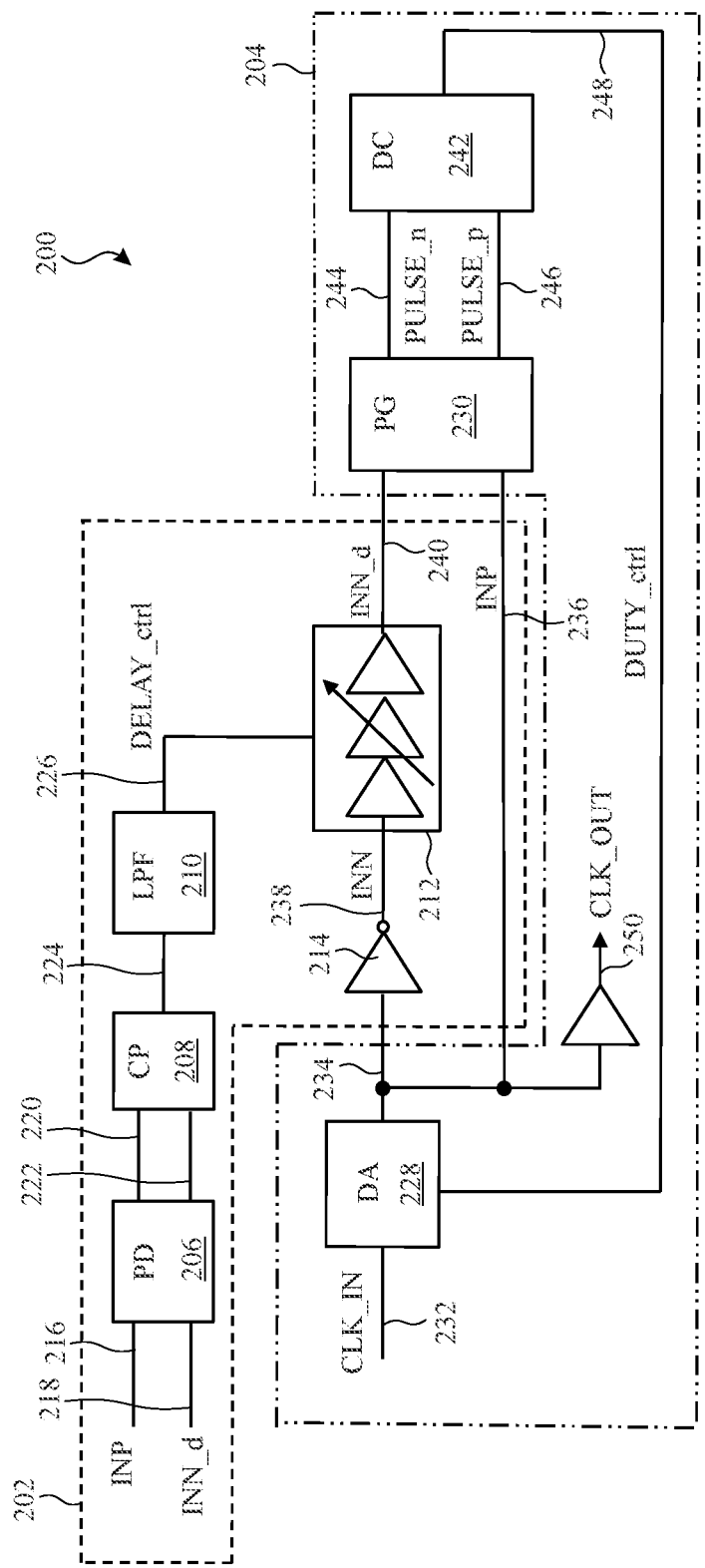
FIG. 2 illustrates a block diagram of a first example of a duty-cycle corrector circuit in accordance with some embodiments.

FIG. 2 illustrates a block diagram of a first example of a DC corrector circuit in accordance with some embodiments. The DC corrector circuit 200 includes a DLL circuit 202 and a DCC circuit 204. The DLL circuit 202 includes a phase detector (PD) circuit 206, a charge pump (CP) circuit 208 operably connected to an output of the PD circuit 206, a low-pass filter (LPF) circuit 210 operably connected to an output of the CP circuit 208, a variable delay circuit 212 operably connected to an output of the LPF circuit 210, and an inverter circuit 214 operably connected to an input of the variable delay circuit 212. Any suitable PD circuit, CP circuit, LPF circuit, and variable delay circuit can be used for the PD circuit 206, the CP circuit 208, the LPF circuit 210, and the variable delay circuit 212, respectively.

In the illustrated embodiment, the PD circuit 206 is operable to detect a phase difference between an INP signal received on signal line 216 and an INN_d signal received on signal line 218. The INP signal is a delayed version of the clock_in (CLK_IN) signal, and the INN_d signal is an inverted and delayed version of the INP signal. In one embodiment, the PD circuit 206 is operable to detect a phase difference between the rising edges of the INP signal and the INN_d signal.

The PD circuit 206 outputs corresponding up/down signals on signal lines 220, 222. The up/down signals drive the CP circuit 208. A CP signal output on signal line 224 is low pass filtered by the LPF circuit 210 to produce a delay control signal (DELAY ctrl) on signal line 226. The DELAY ctrl signal is configured to adjust the delay of the variable delay circuit 212 to reduce the delay between the INP and the INN_d signals. In one embodiment, the DELAY ctrl signal is used to adjust the amount of the delay of the INN_d signal (e.g., adjust the delay of the INN signal input into the variable delay circuit 212). The negative feedback operation of the PD circuit 206 servos the INN_d signal to align with the INP signal.

The DC corrector circuit 204 includes a duty adjusting (DA) circuit 228 operably connected a pulse generator (PG) circuit 230. The CLK_IN signal is received by the DA circuit 228 on signal line 232. The INP signal is output from the DA circuit 228 on signal line 234. The INP signal is input as a first input into the PG circuit 230 on signal line 236. The INP signal is also input into the inverter circuit 214, which outputs an inverted INP signal (the INN signal) on signal line 238. The INN signal is input into the variable delay circuit 212. The variable delay circuit 212 delays the INN signal to output the INN_d signal on signal line 240.

A duty control (DC) circuit 242 is operably connected between an output of the PG circuit 230 and an input of the DA circuit 228. Based on the signal levels of the INP and the INN_d signals, the PG circuit 230 generates a PULSE_n signal on signal line 244 and a PULSE_p signal on signal line 246. In one embodiment, the PG circuit 230 generates the PULSE_n and PULSE_p signals when the INP and the INN_d signals are aligned (e.g., a phase difference between the INP and the INN_d signals is zero or is substantially zero).

The PULSE_n and the PULSE_p signals are received by the DC circuit 242, which generates a DUTY ctrl signal on signal line 248. The DUTY ctrl signal is received by the DA circuit 228 and, based on the signal level of the DUTY ctrl signal, responsively increases or decreases the pulse width of the INP and the INN_d signals until the pulse widths both equal (or substantially equal) fifty percent. When the pulse widths of the INP and the INN_d signal are at or near fifty percent, the pulse widths of the PULSE_p and PULSE_n signals are zero and a duty cycle of a clock_out (CLK_OUT) signal output on signal line 250 is equal to, or substantially equal to, fifty percent.

Figure 3:
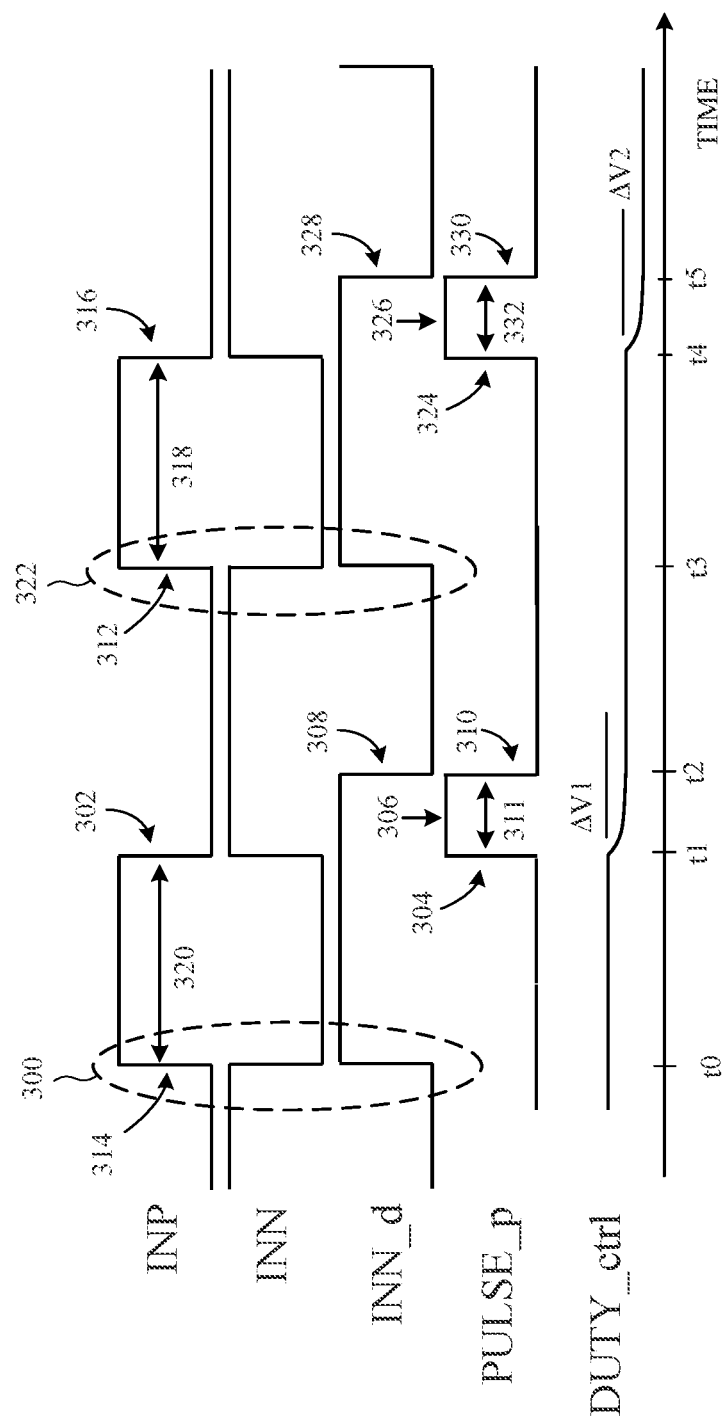
FIG. 3 illustrates an example first timing diagram for the duty-cycle corrector circuit shown in FIG. 2 in accordance with some embodiments.

FIG. 3 illustrates an example first timing diagram for the DC corrector circuit shown in FIG. 2 in accordance with some embodiments. In the illustrated timing diagram, the duty cycle of the INP signal is initially forty percent, the duty cycle of the INN_d signal is sixty percent, and the duty cycle error is twenty percent. When the duty cycle of the INN_d signal is greater than the duty cycle of the INP signal, the duty cycle of the INP signal will be increased until the duty cycle of the INP signal is fifty percent (or substantially fifty percent) and the duty cycle of the INN_d signal will be decreased until the duty cycle of the INN_d signal is fifty percent (or substantially fifty percent). At time t0, the INP signal, the INN signal, and the INN_d signal are in phase, as shown in area 300. Thus, the DLL circuit (e.g., DLL circuit 202 in FIG. 2) has corrected for any phase differences between the rising edges of the INP and the INN_d signals.

At time t1, the falling edge 302 of the INP signal triggers a transition or rising edge 304 in the PULSE_p signal (e.g., a start to a pulse 306). At time t2, the falling edge 308 of the INN_d signal triggers a falling edge 310 in the PULSE_p signal (an end to the pulse 306). In this manner, the timing of the falling edge 302 of the INP signal and the timing of the falling edge 308 of the INN d signal control the pulse width 311 of the pulse 306.

The rising edge 304 of the pulse 306 at time t1 triggers a decrease $\Delta V1$ in the signal level of the DUTY ctrl signal. The pulse width 311 of the pulse 306 controls the time duration of $\Delta V1$ in the signal level of the DUTY ctrl signal (see FIG. 5). Additionally, the decrease of $\Delta V1$ in the DUTY ctrl signal causes the duty cycle of the INP signal to increase and the duty cycle of the INN_d signal to decrease (see FIG. 6A).

In one embodiment, the timing of each rising edge of a subsequent transition in the INP signal is adjusted to repeatedly increase the duty cycle of the INP signal until the duty cycles of the INP and the INN_d signals are fifty, or substantially fifty percent. The rising edge (e.g., 312) of the next transition in the INP signal is caused to occur earlier or faster than the previous rising edge (e.g., 314) while the timing of the falling edge (e.g., 316) of the next transition in the INP signal remains substantially the same as the timing of the previous falling edge (e.g., 302), which causes the duty cycle of the INP signal to increase. Thus, the pulse width 318 is greater than the previous pulse width 320. For example, if the duty cycle of the INP signal increases to forty-two percent, the duty cycle of the INN_d signal decreases to fifty-eight percent. Based on the increase in the duty cycle of the INP signal and the decrease in the duty cycle of the INN_d signal, the duty-cycle error is reduced to sixteen percent.

At time t3, the INP signal, the INN signal, and the INN_d signal remain in phase, as shown in area 322. At time t4, the falling edge 316 of the INP signal triggers a rising edge 324 in the PULSE_p signal (e.g., a start to a pulse 326). At time t5, the falling edge 328 of the INN_d signal triggers a falling edge 330 in the PULSE_p signal (an end to the pulse 326).

The rising edge 324 of the pulse 326 at time t4 triggers another decrease ΔV2 in the signal level of the DUTY ctrl signal. The pulse width 332 of the pulse 326 controls the time duration of ΔV2 in the signal level of the DUTY ctrl signal (see FIG. 5). The decrease of ΔV2 in the DUTY ctrl signal causes the duty cycle of the INP signal to increase and the duty cycle of the INN_d signal to decrease (see FIG. 6A).

Again, in one embodiment, the rising edge of the next transition in the INP signal is caused to occur faster than the rising edge 312 of the previous transition while the timing of the falling edge of the next transition in the INP signal remains substantially the same as the timing of the falling edge 316, which causes the duty cycle of the INP signal to increase. For example, if the duty cycle of the INP signal increases to forty-five percent, the duty cycle of the INN_d signal decreases to fifty-five percent. Based on the increase in the duty cycle of the INP signal and the decrease in the duty cycle of the INN_d signal, the duty-cycle error is reduced to ten percent.

The process of increasing the duty cycle of the INP signal and decreasing the duty cycle of the INN_d signal repeats until the duty cycle of the INP signal is fifty, or substantially fifty percent and the duty cycle of the INN_d signal is fifty, or substantially fifty percent. When the duty cycles of both the INP and the INN_d signals are fifty percent (or substantially fifty percent), the duty-cycle error is zero (or substantially zero).

Figure 4:
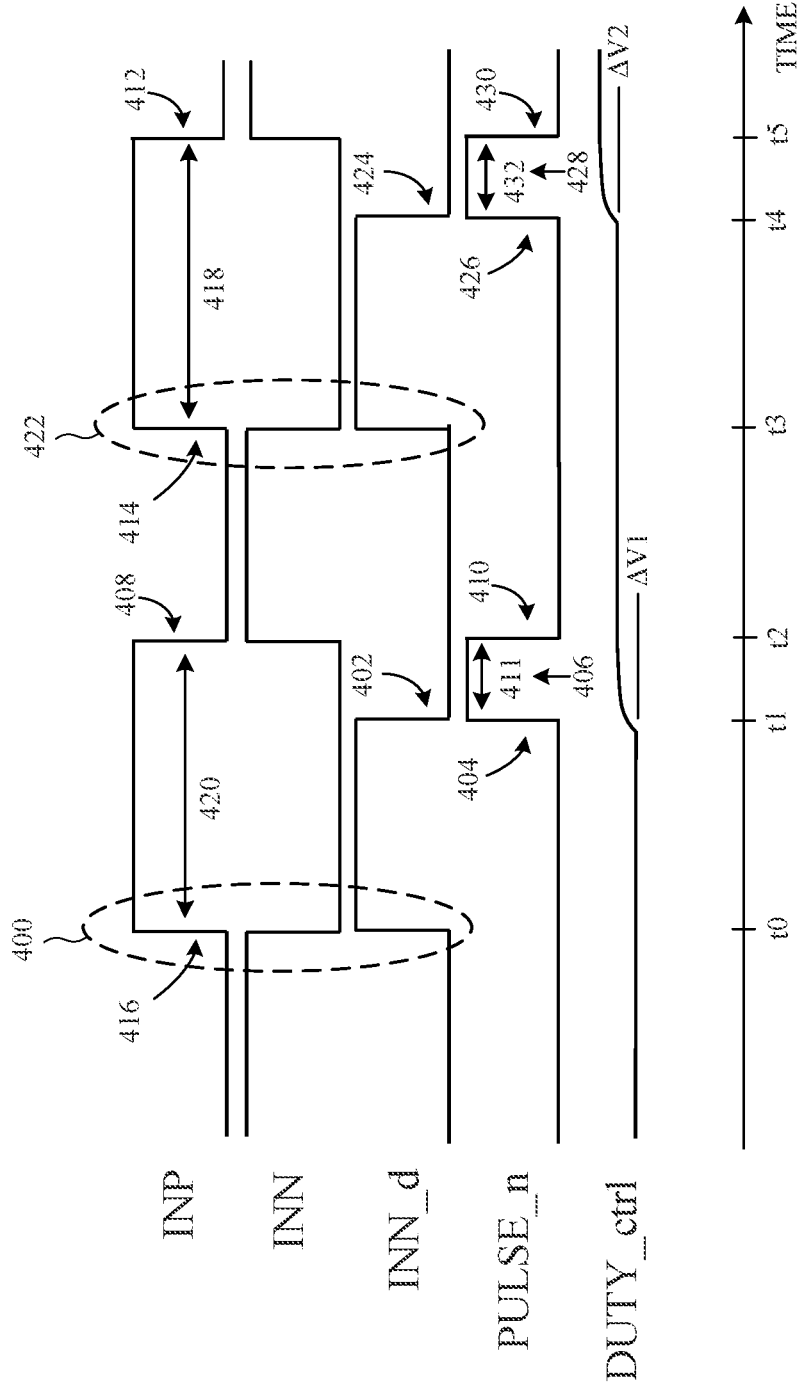
FIG. 4 illustrates an example second timing diagram for the duty-cycle corrector circuit shown in FIG. 2 in accordance with some embodiments.

FIG. 4 illustrates an example second timing diagram for the duty-corrector circuit shown in FIG. 2 in accordance with some embodiments. In the illustrated timing diagram, the duty cycle of the INP signal is initially sixty percent, the duty cycle of the INN_d signal is forty percent, and the duty cycle error is twenty percent. When the duty cycle of the INN_d signal is less than the duty cycle of the INP signal, the duty cycle of the INP signal will be decreased until the duty cycle of the INP signal is fifty, or substantially fifty percent and the duty cycle of the INN_d signal will be increased until the duty cycle of the INN_d signal is fifty, or substantially fifty percent. At time t0, the INP signal, the INN signal, and the INN_d signal are in phase, as shown in area 400. Thus, the DLL circuit (e.g., DLL circuit 202 in FIG. 2) has corrected for any phase differences between the rising edges of the INP and the INN_d signals.

At time t1, the falling edge 402 of the INN_d signal triggers a rising edge 404 in the PULSE_n signal (e.g., a start to a pulse 406). At time t2, the falling edge 408 of the INP signal triggers a falling edge 410 in the PULSE_n signal (an end to the pulse 406). In this manner, the timing of the falling edge 402 of the INN d signal and the timing of the falling edge 408 of the INP signal control the pulse width 411 of the pulse 406.

The rising edge 404 of the pulse 406 at time t1 triggers an increase ΔV1 in the signal level of the DUTY ctrl signal. The pulse width 411 of the pulse 406 controls the time duration of ΔV1 in the signal level of the DUTY ctrl signal (see FIG. 5). Additionally, the increase of ΔV1 in the DUTY ctrl signal causes the duty cycle of the INP signal to decrease and the duty cycle of the INN_d signal to increase (see FIG. 6A).

In one embodiment, the timing of each falling edge of a subsequent transition in the INP signal is adjusted to repeatedly decrease the duty cycle of the INP signal until the duty cycles of the INP and the INN_d signals are fifty, or substantially fifty percent. The falling edge (e.g., 412) of the next transition in the INP signal is caused to occur earlier or faster than the previous falling edge (e.g., 408) while the timing of the rising edge 414 of the next transition in the INP signal remains substantially the same as the previous rising edge 416, which causes the duty cycle of the INP signal to decrease. Thus, the pulse width 418 is less than the previous pulse width 420. For example, if the duty cycle of the INP signal decreases to fifty-eight percent, the duty cycle of the INN_d signal increases to forty-two percent. Based on the decrease in the duty cycle of the INP signal and the increase in the duty cycle of the INN_d signal, the duty-cycle error is reduced to sixteen percent.

At time t3, the INP signal, the INN signal, and the INN_d signal remain in phase, as shown in area 422. At time t4, the falling edge 424 of the INN_d signal triggers another rising edge 426 in the PULSE_n signal (e.g., a start to a pulse 428). At time t5, the falling edge 412 of the INP signal triggers a falling edge 430 in the PULSE_n signal (an end to the pulse 428).

The rising edge 426 of the pulse 428 at time t4 triggers another increase of ΔV2 in the signal level of the DUTY ctrl signal. The pulse width 432 of the pulse 428 controls the time duration of ΔV2 in the signal level of the DUTY ctrl signal (see FIG. 5). The increase ΔV2 in the DUTY ctrl signal causes the duty cycle of the INP signal to decrease and the duty cycle of the INN_d signal to increase.

Again, in one embodiment, the falling edge of the next transition in the INP signal is caused to occur faster than the previous falling edge 412 while the timing of the rising edge of the next transition in the INP signal remains substantially the same as the timing of the previous rising edge 414, which causes the duty cycle of the INP signal to decrease. For example, if the duty cycle of the INP signal decreases to fifty-five percent, the duty cycle of the INN_d signal increases to forty-five percent. Based on the increase in the duty cycle of the INN_d signal and the decrease in the duty cycle of the INP signal, the duty-cycle error is reduced to ten percent.

The process of decreasing the duty cycle of the INP signal and increasing the duty cycle of the INN_d signal repeats until the duty cycle of the INP signal is fifty, or substantially fifty percent and the duty cycle of the INN signal is fifty, or substantially fifty percent. When the duty cycles of both the INP and the INN_d signals are fifty percent (or substantially fifty percent), the duty-cycle error is zero (or substantially zero).

Figure 5:
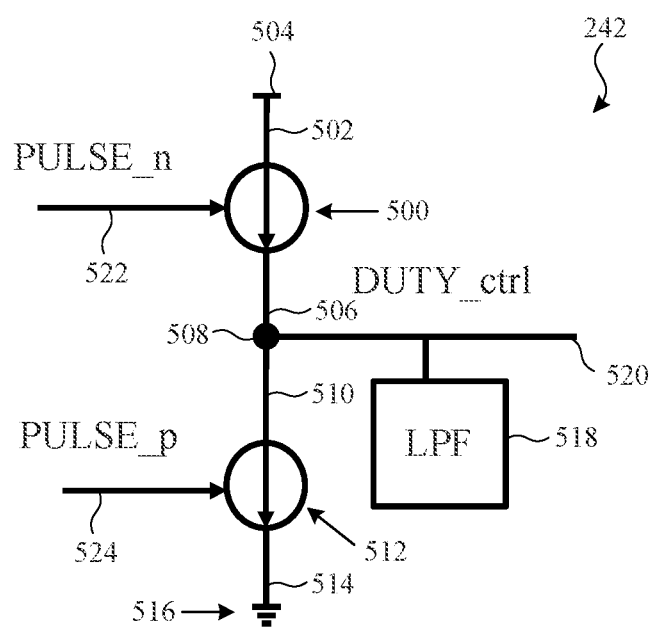
FIG. 5 illustrates a schematic diagram of an example duty control circuit that is suitable for use in the duty-cycle corrector circuit shown in FIG. 2 in accordance with some embodiments.

FIG. 5 illustrates a schematic diagram of an example DC circuit that is suitable for use in the DC corrector circuit shown in FIG. 2 in accordance with some embodiments. A first terminal 502 of a charge pump circuit 500 is operably connected to a voltage source 504 (e.g., VDD) and a second terminal 506 of the charge pump circuit 500 is operably connected to a node 508. A first terminal 510 of another charge pump circuit 512 is operably connected to the node 508 and a second terminal 514 of the charge pump circuit 512 is operably connected to a reference voltage source 516 (e.g., VSS or ground). A low-pass filter (LPF) circuit 518 is operably connected to the node 508.

The charge pump circuit 500 includes one or more charging circuits and the charge pump circuit 512 includes one or more discharging circuits. Essentially, the DC circuit 242 functions as a switch based on the signal levels of the PULSE_n signal and the PULSE_p signal to charge or discharge the LPF circuit 518 and produce the DUTY ctrl signal on signal line 520. The DC circuit 242 receives the PULSE_n signal on signal line 522 and receives the PULSE_p signal on signal line 524. When the PULSE_n signal is active (e.g., signal level is high), current flows from the voltage source 504 to the LPF circuit 518 to charge the LPF circuit 518. Based on the charging of the LPF circuit 518, the signal level of the DUTY ctrl signal on signal line 520 increases (e.g., $\Delta V_n$, where n is a number that equals or is greater than one). As described earlier, when the signal level of the DUTY ctrl signal increases, the duty cycle of the INP signal decreases and the duty cycle of the INN_d signal increases.

Conversely, when the PULSE_p signal is active (e.g., signal level is high), current flows from the LPF circuit 518 to the reference voltage source 516 to discharge the LPF circuit 518. Based on the discharge of the LPF circuit 518, the signal level of the control voltage signal DUTY ctrl decreases (e.g., $\Delta V_n$, where n is a number that equals or is greater than one). As described earlier, when the signal level of the DUTY ctrl signal decreases, the duty cycle of the INP signal increases and the duty cycle of the INN_d signal decreases.

Figure 6A:
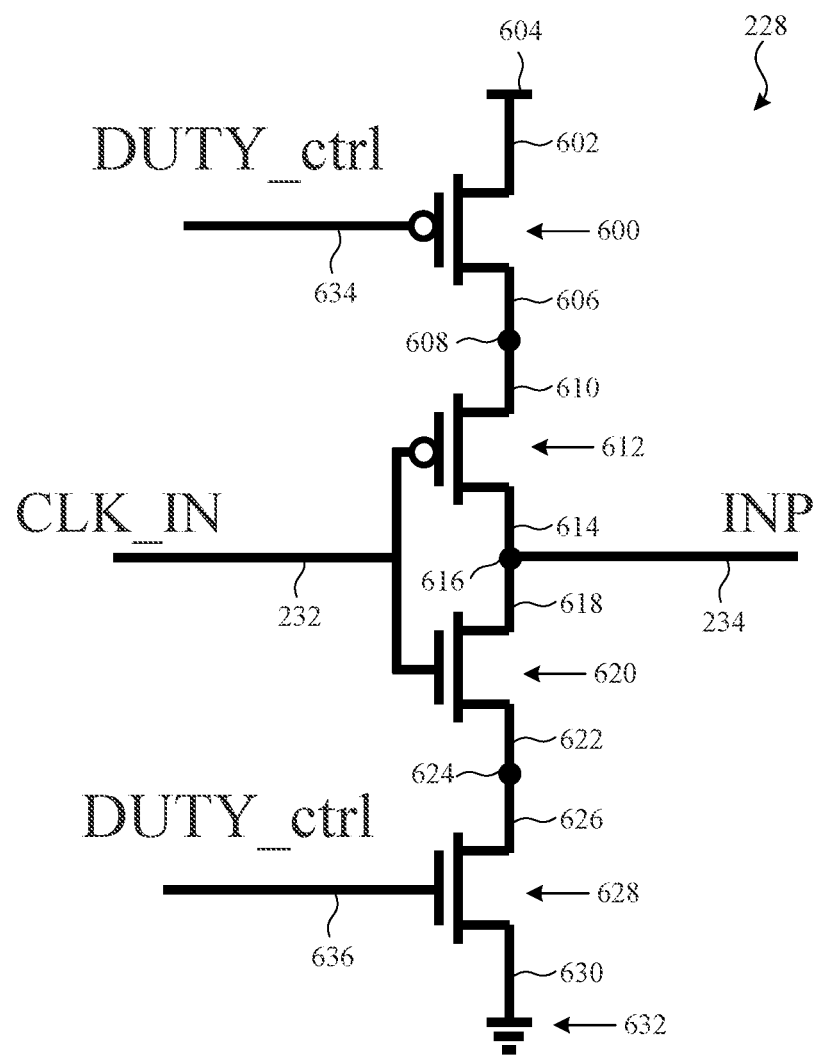
FIG. 6A illustrates a schematic diagram of a first example of a duty adjusting circuit that is suitable for use in the duty-cycle corrector circuit shown in FIG. 2 in accordance with some embodiments.

FIG. 6A illustrates a schematic diagram of a first example of a DA circuit that is suitable for use in the DC corrector circuit shown in FIG. 2 in accordance with some embodiments. The example DA circuit 228 includes four transistors connected in series. A first terminal 602 of a transistor 600 is operably connected to a voltage source 604 and a second terminal 606 of the transistor 600 is operably connected to a node 608. A first terminal 610 of a transistor 612 is operably connected to the node 608 and a second terminal 614 of the transistor 612 is operably connected to a node 616. A first terminal 618 of a transistor 620 is operably connected to the node 616 and a second terminal 622 of the transistor 620 is operably connected to a node 624. A first terminal 626 of a transistor 628 is operably connected to the node 624 and a second terminal 630 of the transistor 628 is operably connected to a reference voltage 632. In the illustrated embodiment, the transistors 600, 612 are p-type transistors (e.g., PMOS transistors) and the transistors 620, 628 are n-type transistors (e.g., NMOS transistors), but other embodiments are not limited to this implementation. For example, the transistors 600, 612 can be n-type transistors and the transistors 620, 628 may be p-type transistors.

The DUTY ctrl signal generated by the DC circuit 242 is received by the gate of the transistor 600 on signal line 634 and by the gate of the transistor 628 on signal line 636. The CLK_IN signal is received by the gates of the transistors 612, 620 on signal line 232. The INP signal is output from the DA circuit 228 on signal line 234.

The DA circuit 228 is operable to change the timing of the rising edge of the INP signal, which in turn adjusts the duty cycle of the INP signal. When the signal level of the DUTY ctrl signal is decreasing and the signal level of the CLK_IN signal is low, the transistors 600, 612 turn on to cause the rising edge of the next INP signal to occur faster than the previous rising edge. In this manner, the duty cycle of the INP signal increases (see e.g., the timing diagram in FIG. 3). When the signal level of the DUTY ctrl signal is increasing and the signal level of the CLK_IN signal is high, the transistors 620, 628 turn on to cause the falling edge of the next INP signal to occur faster than the previous falling edge. In this manner, the duty cycle of the INP signal decreases (see e.g., the timing diagram in FIG. 4).

Figure 6B:
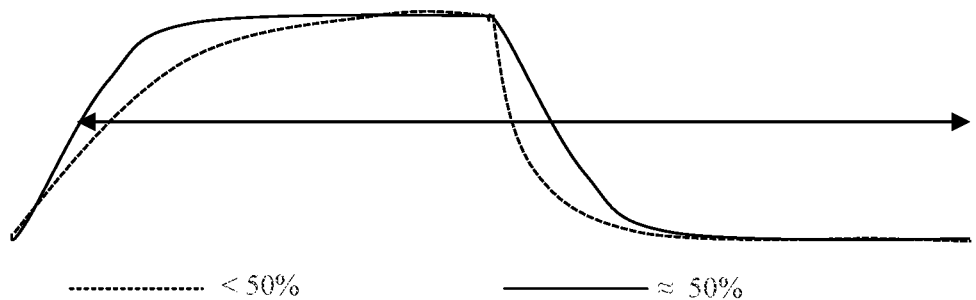
FIG. 6B illustrates an example waveform of an INP signal with a duty cycle that is less than a given value and an example waveform of the INP signal with an adjusted duty cycle that is substantially equal to the given value in accordance with some embodiments.

FIG. 6B illustrates an example waveform of an INP signal with a duty cycle that is less than a given value and an example waveform of the INP signal with an adjusted duty cycle that is substantially equal to the given value in accordance with some embodiments. FIG. 6B shows an embodiment where the duty cycle of the INP signal is to be increased. The dashed-line waveform represents the INP signal with a duty cycle that is less than the given value of fifty percent and the solid-line waveform represents the INP signal with the adjusted duty cycle of fifty (or substantially fifty percent).

As described earlier, the duty cycle of the INP signal increases when the signal level of the DUTY ctrl signal is decreasing and the signal level of the CLK_IN signal is low. The transistors 600, 612 turn on to cause the rising edge of the next INP signal to occur faster than the previous rising edge. In the embodiment illustrated in FIG. 6A, when the DUTY ctrl signal decreases, the transistor-turn-on resistance (Ron) of the p-type transistor 600 decreases and the Ron of the n-type transistor 628 increases, which causes the duty cycle of the INP signal to increase. When the duty cycle of the INP signal is fifty, or substantially fifty percent, the Ron of the p-type transistor 600 equals (or substantially equals) the Ron of the n-type transistor 628.

Alternatively, when the duty cycle of the INP signal is to decrease (not shown in FIG. 6B), the signal level of the DUTY ctrl signal is increased and the signal level of the CLK_IN signal is high. The transistors 620, 628 turn on to cause the falling edge of the next INP signal to occur faster than the previous falling edge. In the embodiment illustrated in FIG. 6A, when the DUTY ctrl signal increases, the Ron of the p-type transistor 600 increases and the Ron of the n-type transistor 628 decreases, which causes the duty cycle of the INP signal to decrease.

Figure 7:
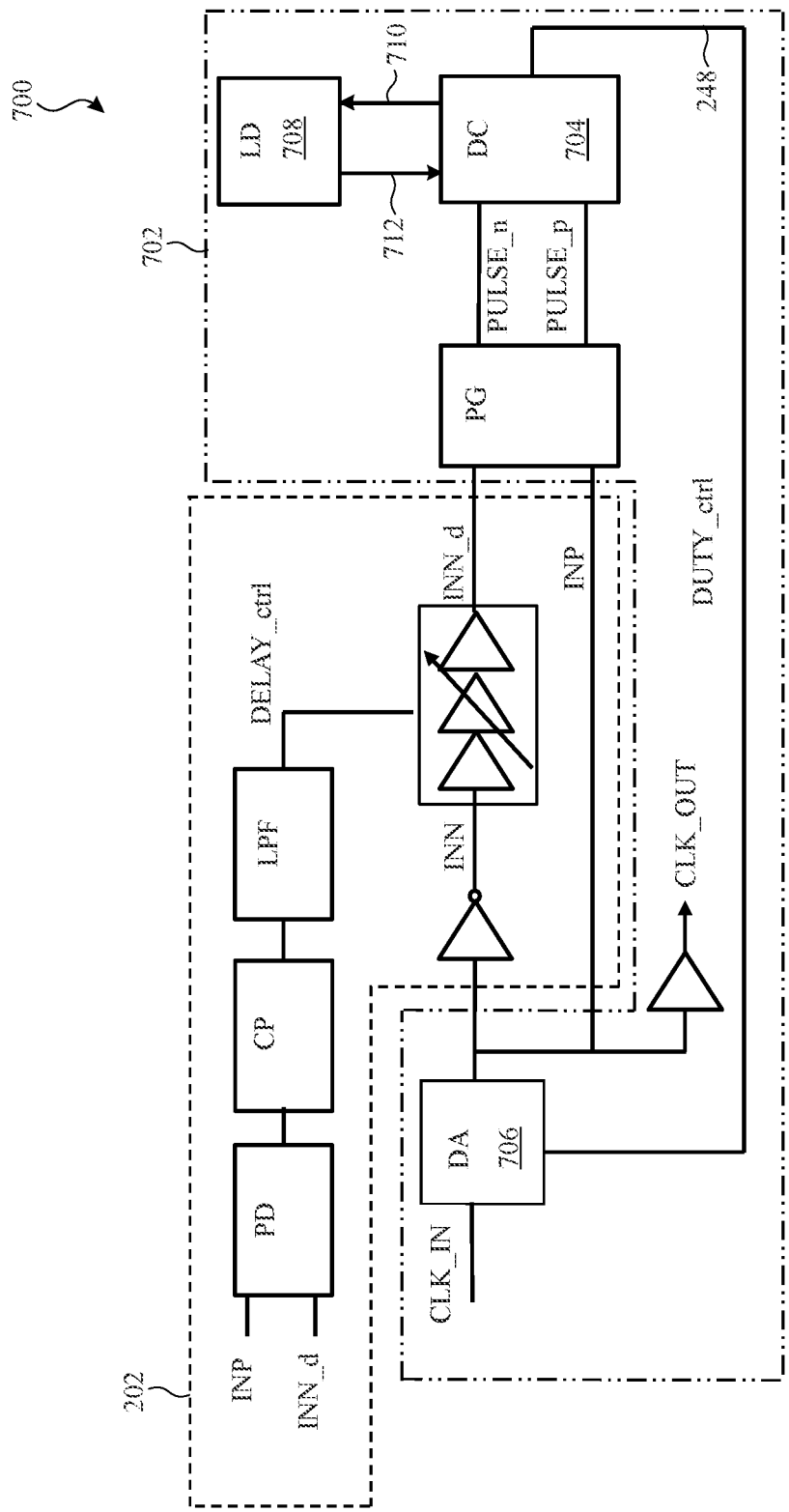
FIG. 7 illustrates a block diagram of a second example of a duty-cycle corrector circuit in accordance with some embodiments.

FIG. 7 illustrates a block diagram of a second example of a DC corrector circuit in accordance with some embodiments. The DC corrector circuit 700 is similar to the DC corrector circuit 200 shown in FIG. 2 except for the DCC circuit 702. In particular, the DCC circuit 702 includes a different DC circuit 704, a different DA circuit 706, and a lock detector (LD) circuit 708. In the illustrated embodiment, the DC circuit 704 is and an up and down (UP/DN) counter circuit. Any suitable type of an UP/DN counter circuit can be used.

The DC circuit 704 (e.g., the UP/DN counter circuit) counts the PULSE_p and the PULSE_n pulses to adjust the DUTY ctrl signal (e.g., an UP/DN code signal) on signal line 248. The DUTY ctrl signal is received by the DA circuit 706. When the DC circuit 704 is an UP/DN counter circuit, the DUTY ctrl signal is an UP/DN code that represents the UP count and the DN count. As will be described in more detail in conjunction with FIG. 8, one or more transistors are turned on and turned off based on the PULSE_p and PULSE_n counts represented by the DUTY ctrl signal.

The LD circuit 708 receives the DUTY ctrl signal (e.g., the current UP and DN counts) on signal line 710. When the DUTY ctrl signal changes (e.g., the counts are changing over a given number of cycles), the LD circuit 708 outputs a lock-out signal on signal line 712. The lock-out signal indicates the duty cycles of the INP and the INN_d signals are not at (or substantially at) a given value, such as fifty percent (or substantially fifty percent).

When the DUTY ctrl signal remains a constant value over a given time period (e.g., the counts do not change over a given number of cycles), the CLK_out signal has a duty cycle of fifty percent (or substantially fifty percent). The LD circuit 708 outputs a "lock-in" signal when the counts do not change over the given number of cycles, which indicates the duty cycles of the INP and the INN_d signals are at (or substantially at) a given value, which in the illustrated embodiment is fifty percent (or substantially fifty percent). The lock-in signal indicates the duty-cycle error equals zero (or substantially zero). The lock-in signal locks the DCC circuit 702, which causes the value of the DUTY ctrl signal to remain constant (e.g., the value of the UP/DN code remains constant).

Figure 8:
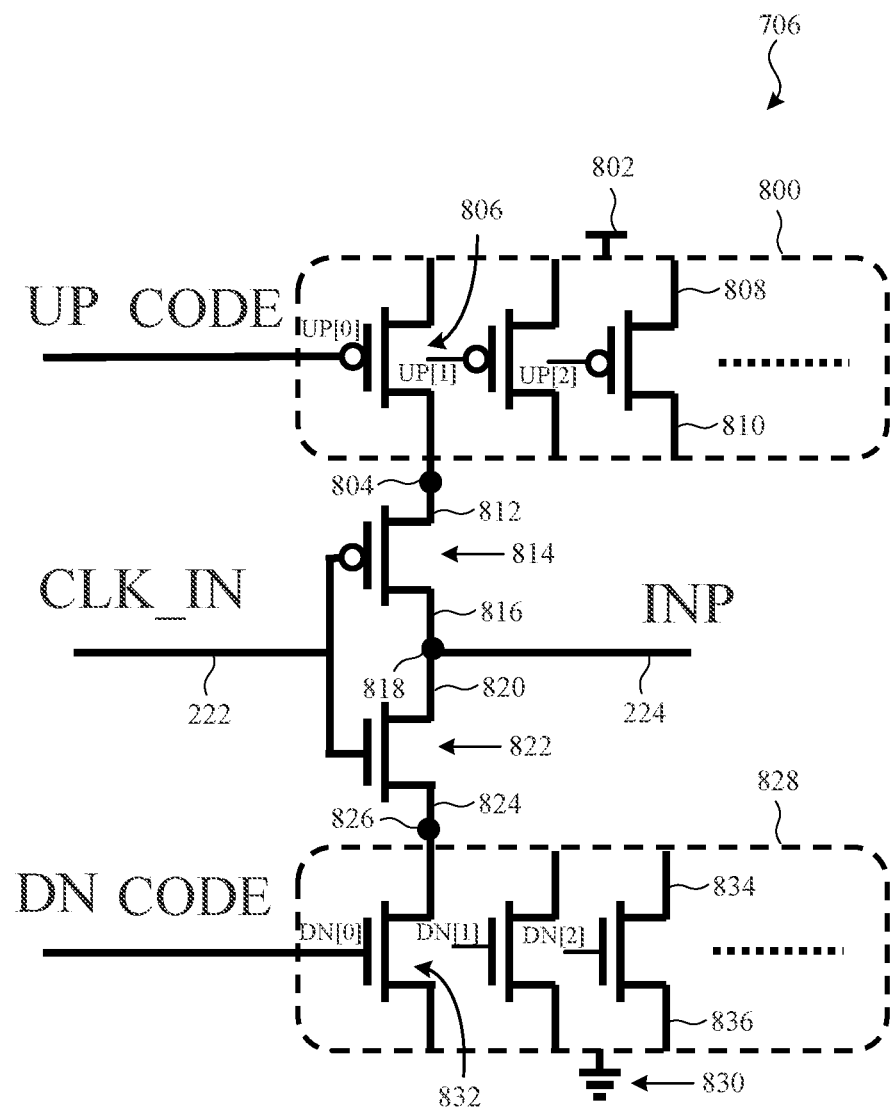
FIG. 8 illustrates a schematic diagram of a second example of a duty adjusting circuit that is suitable for use in the duty-cycle corrector circuit shown in FIG. 7 in accordance with some embodiments.

FIG. 8 illustrates a schematic diagram of a second example of a DA circuit that is suitable for use in the DC corrector circuit shown in FIG. 7 in accordance with some embodiments. The DA circuit 706 includes a transistor block 800 operably connected between a voltage source 802 (e.g., VDD) and a node 804. The transistor block 800 includes one or more transistors 806 connected in parallel, where a first terminal 808 of each transistor is operably connected to the voltage source 802 and a second terminal 810 is operably connected to the node 804.

A first terminal 812 of a transistor 814 is operably connected to the node 804 and a second terminal 816 of the transistor 814 is operably connected to a node 818. A first terminal 820 of a transistor 822 is operably connected to the node 818 and a second terminal 824 of the transistor 822 is operably connected to a node 826. A transistor block 828 is operably connected between the node 826 and a reference voltage source 830 (e.g., ground). The transistor block 828 includes one or more transistors 832 connected in parallel, where a first terminal 834 of each transistor 832 is operably connected to the node 826 and a second terminal 836 of each transistor 832 is operably connected to the reference voltage source 830.

In the illustrated embodiment, the transistor(s) 806 and the transistor 814 are p-type transistors and the transistor 822 and the transistor(s) 832 are n-type transistors. When the PULSE n signal is active, the DN code will decrease and the UP code will increase. When the signal level of the CLK_IN is low, the transistor 822 and the transistor block 828 turn off while the transistor 814 and one or more transistors 806 in the transistor block 800 turn on. The transistors 806 in the transistor block 800 turn on step by step (e.g., with each increase in the UP code). Accordingly, when the UP code is one, the UP[0] signal is active to turn on one transistor 806. When the UP code is two, the UP[0] and the UP[1] signals are active to turn on two transistors 806, and so on. In this manner, the duty cycle of the INP signal increases.

When the PULSE_p signal is active, the DN code will increase and the UP code will decrease. When the signal level of the CLK_IN is high, the transistor 814 and the transistor block 800 turn off while the transistor 822 and one or more transistors 832 in the transistor block 828 turn on.

The transistors 832 in the transistor block 828 turn on step by step (e.g., with each increase in the DN code). Accordingly, when the DN code is one, the DN[0] signal is active to turn on one transistor 832. When the DN code is two, the DN[0] and the DN[1] signals are active to turn on two transistors 832, and so on. In this manner, the duty cycle of the INP signal decreases. In other embodiments, the transistor(s) 806 and the transistor 814 can be n-type transistors and the transistor 822 and the transistor(s) 832 may be p-type transistors.

Figure 9:
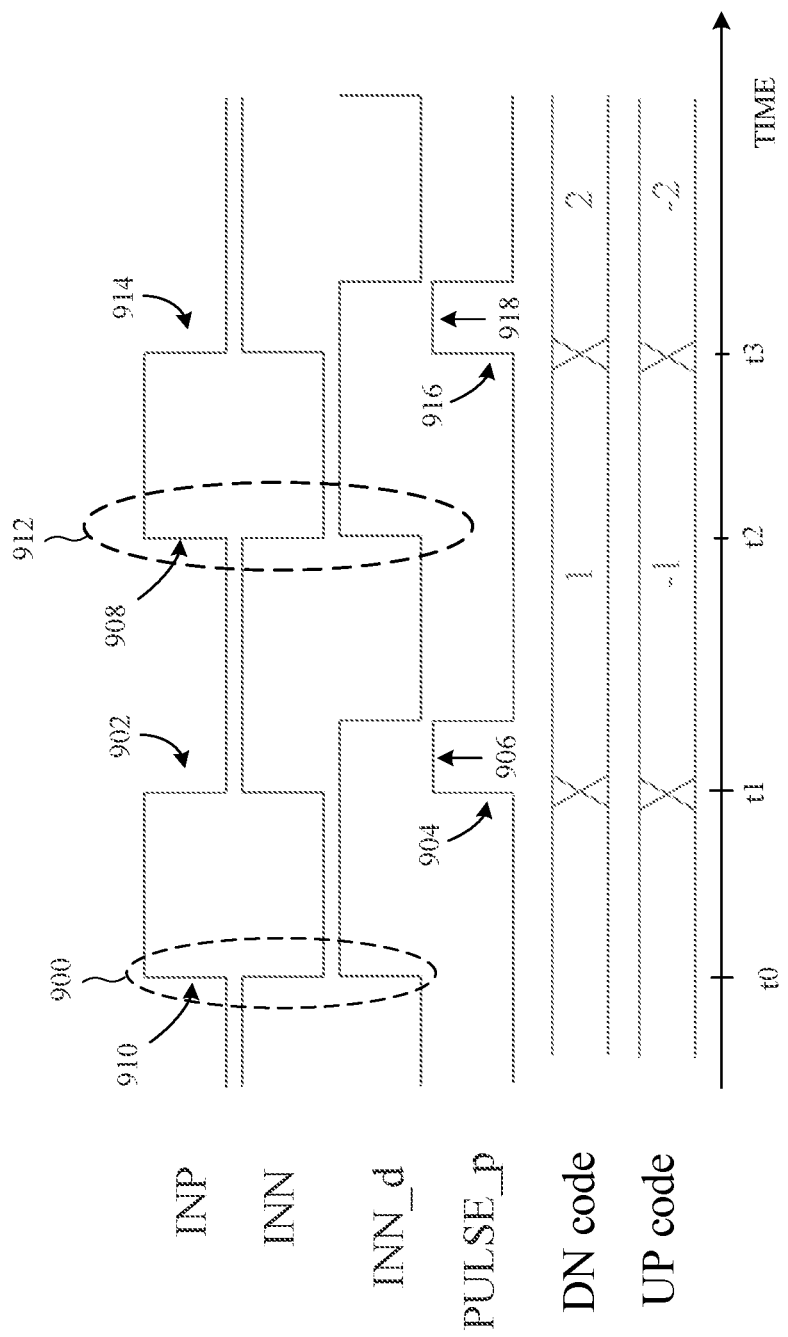
FIG. 9 illustrates an example first timing diagram for the duty-cycle corrector circuit shown in FIG. 7 in accordance with some embodiments.

FIG. 9 illustrates an example first timing diagram for the duty-cycle corrector circuit shown in FIG. 7 in accordance with some embodiments. In the illustrated timing diagram, the duty cycle of the INP signal is initially forty percent and the duty cycle of the INN_d signal is sixty percent. As described earlier, when the duty cycle of the INN_d signal is greater than the duty cycle of the INP signal, the duty cycle of the INP signal will be increased until the duty cycle of the INP signal is fifty percent (or substantially fifty percent) and the duty cycle of the INN_d signal will be decreased until the duty cycle of the INN_d signal is fifty percent (or substantially fifty percent). At time t0, the INP signal, the INN signal, and the INN_d signal are in phase, as shown in area 900. Thus, the DLL circuit (e.g., DLL circuit 202 in FIG. 2) has corrected for any phase differences between the rising edges of the INP and the INN_d signals. At time t0, both the DN code and the UP code equal zero. At time t1, the falling edge 902 of the INP signal triggers a rising edge 904 in the PULSE_p signal (e.g., a start to a pulse 906). Based on the pulse 906, the DN code increases by one to positive one and the UP code decreases by one to negative one. The increase in the DN code and the decrease in the UP code causes the rising edge 908 of the next transition in the INP signal to occur faster than the rising edge 910 of the previous transition. For example, in the embodiment shown in FIG. 8, the transistor 814 and the transistor block 800 turn off while the transistor 822 and the transistor 832 associated with the DN[0] input in the transistor block 828 turn on to adjust the timing of the rising edge of the INP signal.

At time t2, the INP signal, the INN signal, and the INN_d signal remain in phase, as shown in area 912. At time t3, the falling edge 914 of the INP signal triggers a rising edge 916 in the PULSE_p signal (e.g., a start to a pulse 918). Based on the pulse 918, the DN code increases by one to positive two and the UP code decreases by one to negative two. The increase in the DN code and the decrease in the UP code causes the rising edge of the next transition in the INP signal to occur faster than the rising edge 908 of the transition. For example, in the embodiment shown in FIG. 8, the transistor 814 and the transistor block 800 turn off while the transistor 822 and the transistors 832 associated with the DN[0] and the DN[1] inputs in the transistor block 828 turn on to adjust the timing of the rising edge of the INP signal.

Figure 10:
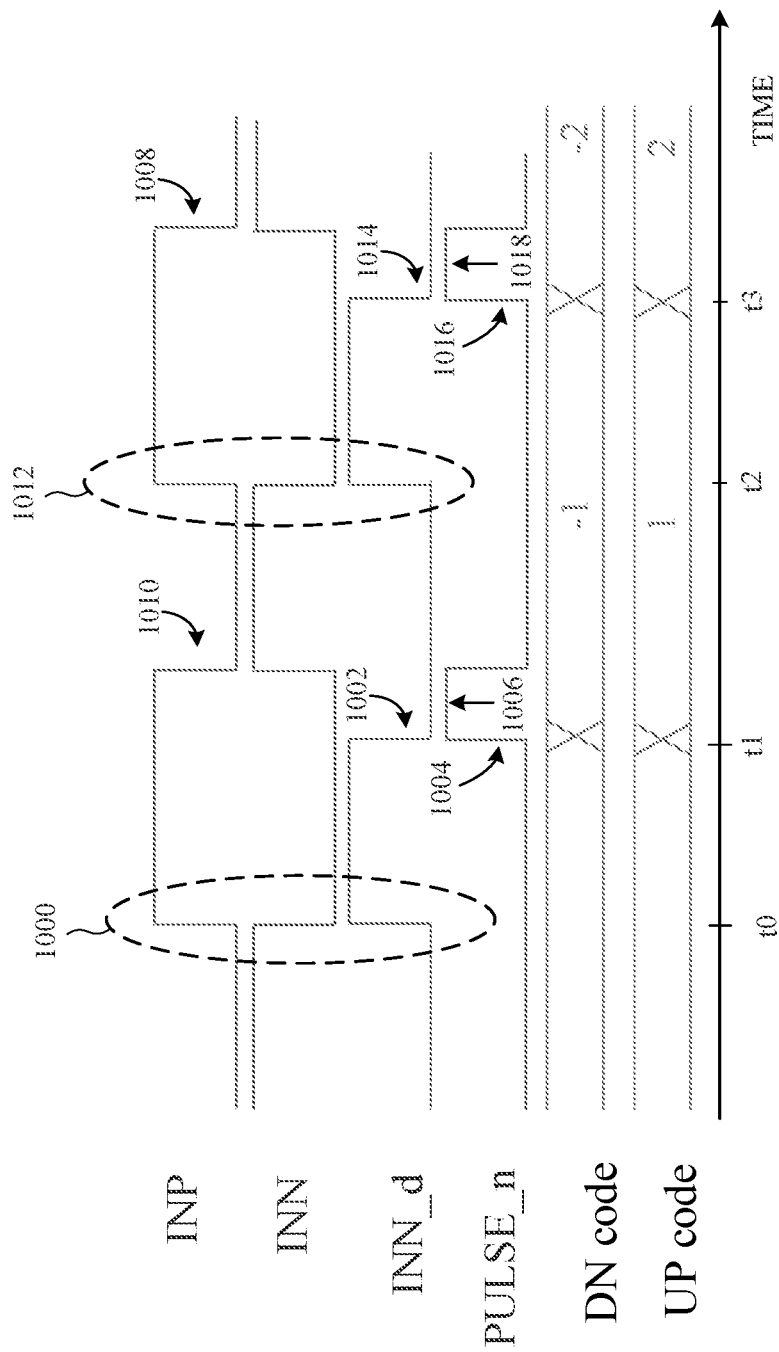
FIG. 10 illustrates an example second timing diagram for the duty-cycle corrector circuit shown in FIG. 7 in accordance with some embodiments.

FIG. 10 illustrates an example second timing diagram for the duty-cycle corrector circuit shown in FIG. 7 in accordance with some embodiments. In the illustrated timing diagram, the duty cycle of the INP signal is initially sixty percent and the duty cycle of the INN_d signal is forty percent. As described earlier, when the duty cycle of the INN_d signal is less than the duty cycle of the INP signal, the duty cycle of the INP signal will be decreased until the duty cycle of the INP signal is fifty percent (or substantially fifty percent) and the duty cycle of the INN_d signal will be increased until the duty cycle of the INN_d signal is fifty percent (or substantially fifty percent). At time t0, the INP signal, the INN signal, and the INN_d signal are in phase, as shown in area 1000. Thus, the DLL circuit (e.g., DLL circuit 202 in FIG. 2) has corrected for any phase differences between the rising edges of the INP and the INN_d signals.

At time t0, both the DN code and the UP code equal zero. At time t1, the falling edge 1002 of the INN_d signal triggers a rising edge 1004 in the PULSE_n signal (e.g., a start to a pulse 1006). Based on the pulse 1006, the DN code decreases by one to negative one and the UP code increases by one to positive one. The increase in the UP code and the decrease in the DN code causes the falling edge 1008 of the next transition in the INP signal to occur faster than the falling edge 1010 of the previous transition. For example, in the embodiment shown in FIG. 8, the transistor 822 and the transistor block 828 turn off while the transistor 814 and the transistor 806 associated with the UP[0] input in the transistor block 800 turn on to adjust the timing of the falling edge of the INP signal.

At time t2, the INP signal, the INN signal, and the INN_d signal remain in phase, as shown in area 1012. At time t3, the falling edge 1014 of the INN_d signal triggers a rising edge 1016 in the PULSE_n signal (e.g., a start to a pulse 1018). Based on the pulse 1018, the UP code increases by one to positive two and the DN code decreases by one to negative two. The increase in the UP code and the decrease in the DN code causes the falling edge of the next transition in the INP signal to occur faster than the falling edge 1008. For example, in the embodiment shown in FIG. 8, the transistor 822 and the transistor block 828 turn off while the transistor 814 and the transistors 806 associated with the UP[0] and the UP[1] inputs in the transistor block 800 turn on to adjust the timing of the falling edge of the INP signal.

Figure 11:
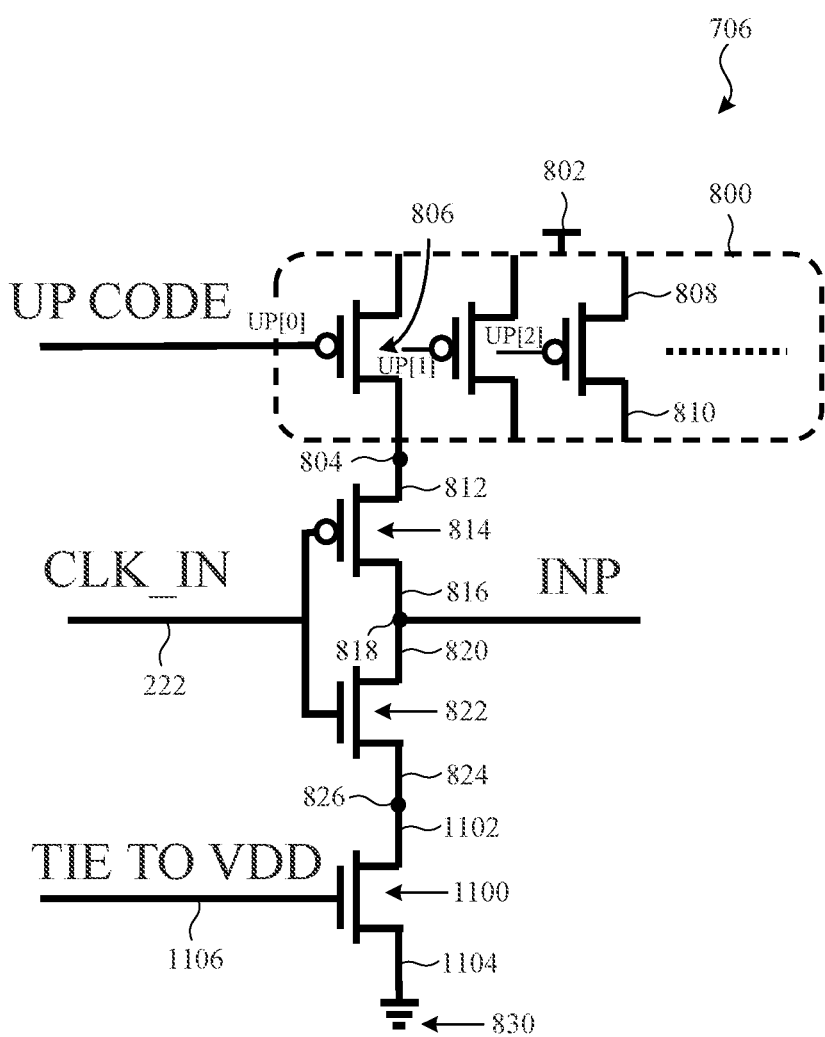
FIG. 11 illustrates a schematic diagram of a third example of a DA circuit that is suitable for use in the DC corrector circuit shown in FIG. 7 in accordance with some embodiments.

FIG. 11 illustrates a schematic diagram of a third example of a DA circuit that is suitable for use in the DC corrector circuit shown in FIG. 7 in accordance with some embodiments. The DA circuit 706 is implemented with only p-type transistor control of the duty cycle of the INP signal. The DA circuit 706 includes the transistor block 800 operably connected between a voltage source 802 (e.g., VDD) and a node 804. The transistor block 800 includes one or more transistors 806 connected in parallel, where a first terminal 808 of each transistor is operably connected to the reference voltage source 830 and a second terminal 810 is operably connected to the node 804.

A first terminal 812 of a transistor 814 is operably connected to the node 804 and a second terminal 816 of the transistor 814 is operably connected to a node 818. A first terminal 820 of a transistor 822 is operably connected to the node 818 and a second terminal 824 of the transistor 822 is operably connected to a node 826. A transistor 1100 is operably connected between the node 826 and a reference voltage source 830 (e.g., ground). A first terminal 1102 of the transistor 1100 is operably connected to the node 826 and a second terminal 1104 of the transistor 1100 is operably connected to the reference voltage source 830. The gate 1106 of the transistor 1100 is connected to the voltage source VDD. As such, the transistor 1100 is operating in the cutoff region and acts as an open switch (e.g., is turned off).

In the illustrated embodiment, the transistor(s) 806 and the transistor 814 are p-type transistors and the transistors 822, 1100 are n-type transistors. When the PULSE n signal is active, the UP code will increase. When the signal level of the CLK_IN is low, the transistor 822 and the transistor 1100 turn off while the transistor 814 and one or more transistors 806 in the transistor block 800 turn on. The transistor(s) 806 in the transistor block 800 turn on step by step (e.g., with each increase in the UP code). Accordingly, when the UP code is one, the UP[0] signal is active to turn on one transistor 806. When the UP code is two, the UP[0] and the UP[1] signals are active to turn on two transistors 806, and so on. In this manner, the duty cycle of the INP signal increases.

When the PULSE_p signal is active, the UP code will decrease. When the signal level of the CLK_IN is high, the transistor 814 and the transistor block 800 turn off and the transistor 822 turns on. Since the transistor 1100 is operating in the cutoff region, the duty cycle of the INP signal does not change.

Figure 12:
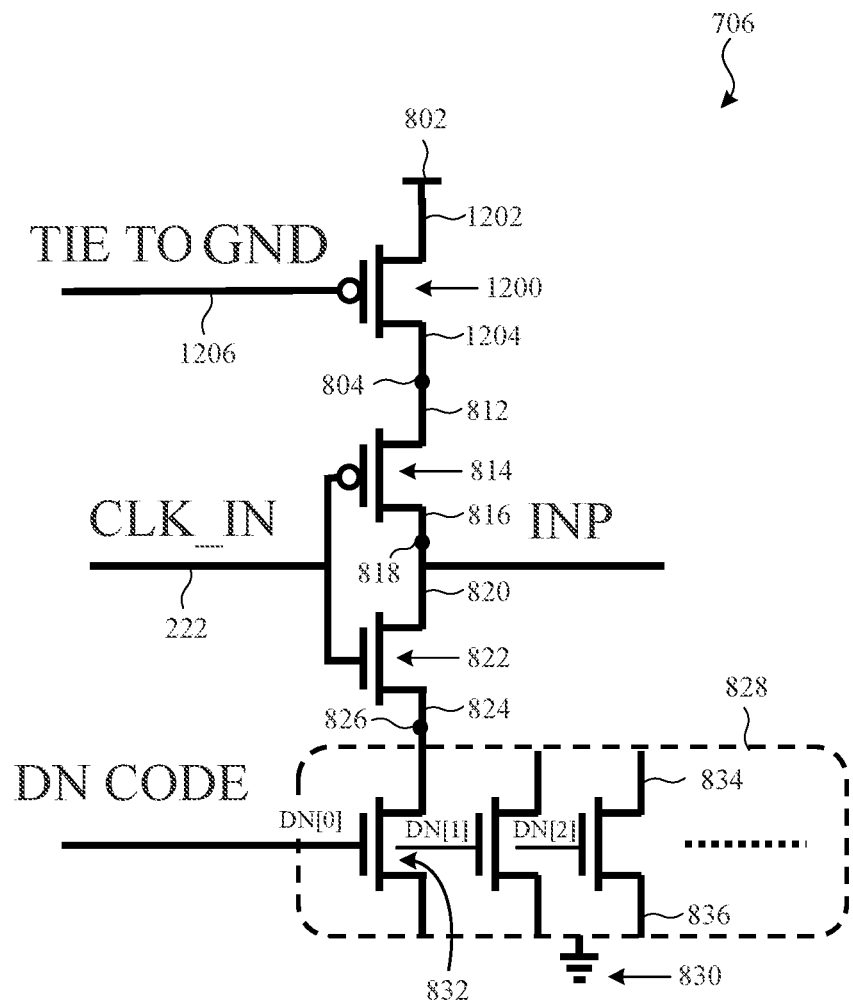
FIG. 12 illustrates a schematic diagram of a fourth example of a DA circuit that is suitable for use in the DC corrector circuit shown in FIG. 7 in accordance with some embodiments.

FIG. 12 illustrates a schematic diagram of a fourth example of a DA circuit that is suitable for use in the DC corrector circuit shown in FIG. 7 in accordance with some embodiments. The DA circuit 706 is implemented with only n-type transistor control of the duty cycle of the INP signal. The DA circuit 706 includes a transistor 1200 operably connected between a voltage source 802 and a node 804. A first terminal 1202 of the transistor 1200 is operably connected to the voltage source 802 and a second terminal 1204 is operably connected to the node 804. The gate 1206 of the transistor 1200 is connected to ground. As such, the transistor 1200 is operating in the cutoff region and acts as an open switch (e.g., is turned off).

A first terminal 812 of a transistor 814 is operably connected to the node 804 and a second terminal 816 of the transistor 814 is operably connected to a node 818. A first terminal 820 of a transistor 822 is operably connected to the node 818 and a second terminal 824 of the transistor 822 is operably connected to a node 826. The transistor block 828 is operably connected between the node 826 and a reference voltage source 830 (e.g., ground). The transistor block 828 includes one or more transistors 832 connected in parallel, where a first terminal 834 of each transistor 832 is operably connected to the node 826 and a second terminal 836 of each transistor 832 is operably connected to the reference voltage source 830.

In the illustrated embodiment, the transistor 1200 and the transistor 814 are p-type transistors and the transistor 822 and each transistor 832 are n-type transistors. When the PULSE_p signal is active, the DN code will increase. When the signal level of the CLK_IN is high, the transistor 814 turns off and the transistor 822 and the transistor block 828 turn on. The transistor(s) 832 in the transistor block 828 turn on step by step (e.g., with each increase in the DN code). Accordingly, when the DN code is one, the DN[0] signal is active to turn on one transistor 832. When the DN code is two, the DN[0] and the DN[1] signals are active to turn on two transistors 832, and so on. In this manner, the duty cycle of the INP signal decreases.

When the PULSE n signal is active and the signal level of the CLK_IN is low, the transistor 814 turns on and the transistor 822 and the transistor block 828 turn off. Since the transistor 1200 is operating in the cutoff region, the duty cycle of the INP signal does not change.

Figure 13:
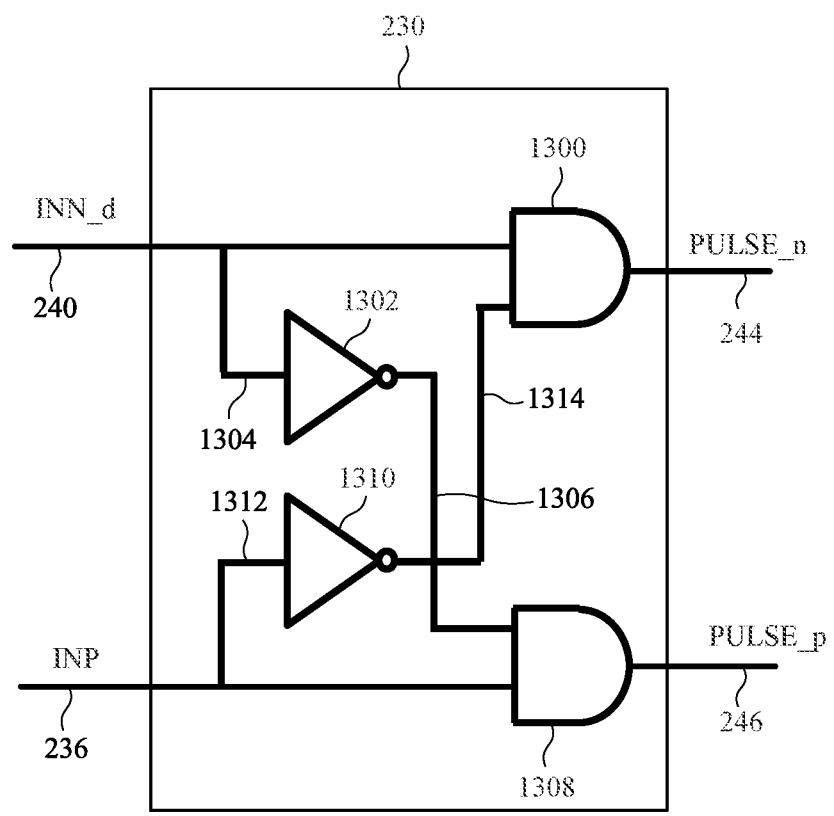
FIG. 13 illustrates a schematic diagram of an example pulse generator circuit that is suitable for use in the duty-cycle corrector circuits shown in FIG. 2 and FIG. 7 in accordance with some embodiments.

FIG. 13 illustrates a schematic diagram of an example PG circuit that is suitable for use in the duty-cycle corrector circuits shown in FIG. 2 and FIG. 7 in accordance with some embodiments. The INN_d signal is input as a first input into a NAND gate 1300 on signal line 240 and input into an inverter circuit 1302 on signal line 1304. An inverted INN_d signal is output from the inverter circuit 1302 on signal line 1306 and input as a first input into the NAND gate 1308. The INP signal is input as a second input into the NAND gate 1308 on signal line 236 and input into an inverter circuit 1310 on signal line 1312. The inverted INP signal is output from the inverter circuit 1310 on signal line 1314 and input as a second input into the NAND gate 1300.

When the signal level of the INN_d signal is high and the signal level of the INP signal is low, a pulse is produced in the PULSE_n signal and the signal level of the PULSE_p signal is low. When the signal level of the INN_d signal is low and the signal level of the INP signal is high, a pulse is produced in the PULSE_p signal and the signal level of the PULSE_n signal is low. The signal levels of the PULSE_p and the PULSE_n signals are low when the signal levels of the INN_d and the INP signals are both high or are both low. The PG circuit 230 can be configured differently in other embodiments.

Figure 14:
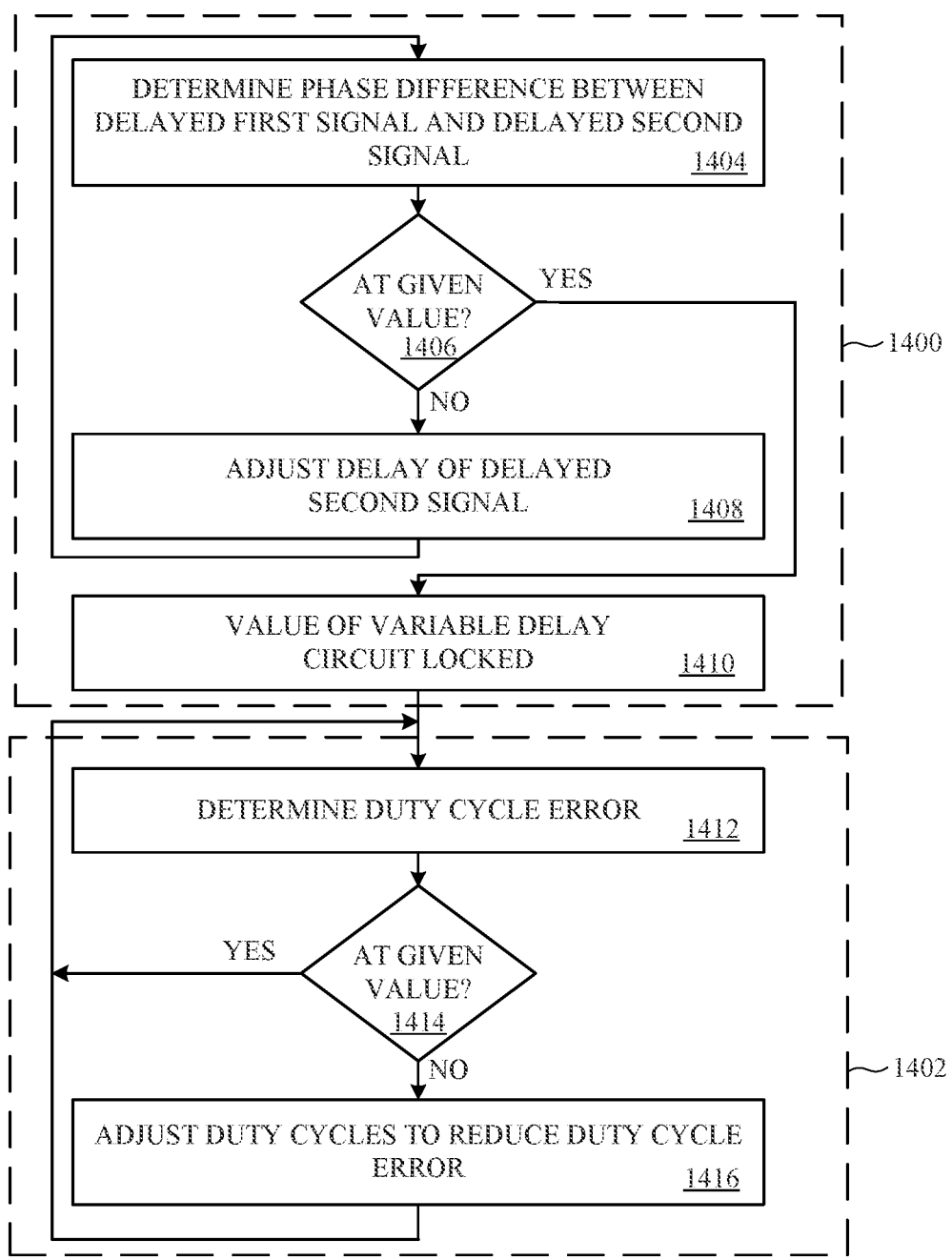
FIG. 14 illustrates a flowchart of a method of operating the duty-cycle corrector circuit shown in FIG. 2 in accordance with some embodiments.

FIG. 14 illustrates a flowchart of a method of operating the DC corrector circuit shown in FIG. 2 in accordance with some embodiments. In one embodiment, the phase difference between the INP and the INN_d signals is reduced to a given value (or reduced to substantially the given value) at block 1400. In one embodiment, the given value is zero. At block 1402, the duty cycles of the INP and the INN_d signals are adjusted to be a given value, or to substantially the given value, (e.g., fifty, or substantially fifty percent) such that the duty-cycle error is zero or substantially zero.

Block 1400 begins at block 1404, where a phase difference between a delayed first signal (the INP signal) and a delayed second signal (the INN_d signal) is determined. A determination is made at block 1406 as to whether the phase difference equals, or substantially equals, a given value (e.g., zero). When a determination is made that the phase difference is greater than the given value, the method continues at block 1408 where the delay of the delayed second signal is adjusted, and the method returns to block 1404. In the example embodiment of FIG. 2, the delay of the variable delay circuit 212 is adjusted to adjust the delay of the INN_d signal and reduce the phase difference.

When a determination is made at block 1406 that the phase difference equals or substantially equals the given value, the method passes to block 1410 where the value of the delay for the variable delay circuit (e.g., variable delay circuit 212 in FIG. 2) is locked (e.g., the DLL circuit is locked). The method then passes to block 1402. Block 1402 begins at block 1412, where a duty-cycle error between the delayed first signal (the INP signal) and the delayed second signal (the INN_d signal) is determined. A determination is made at block 1414 as to whether the duty-cycle error equals, or substantially equals, a given value (e.g., zero). When a determination is made that the duty-cycle error is greater than the given value, the method continues at block 1416 where the duty cycles of the delayed first signal and the delayed second signal are adjusted to reduce the duty-cycle error and the method returns to block 1412. In one embodiment, the duty cycle of the delayed first signal (the INP signal) is adjusted, which results in the adjustment of the duty cycle of the second delayed signal (the INN_d signal). In the example embodiment of FIG. 2, the duty cycle of the INP signal is adjusted by the DA circuit 228 until the duty cycles of the delayed first and the delayed second signals equal or substantially equal fifty percent. In the illustrated embodiment, block 1402 is a calibration loop that operates in the background. Accordingly, the method returns to block 1412 when a determination is made at block 1414 that the duty-cycle error equals, or substantially equals, the given value (e.g., zero or substantially zero).

Figure 15:
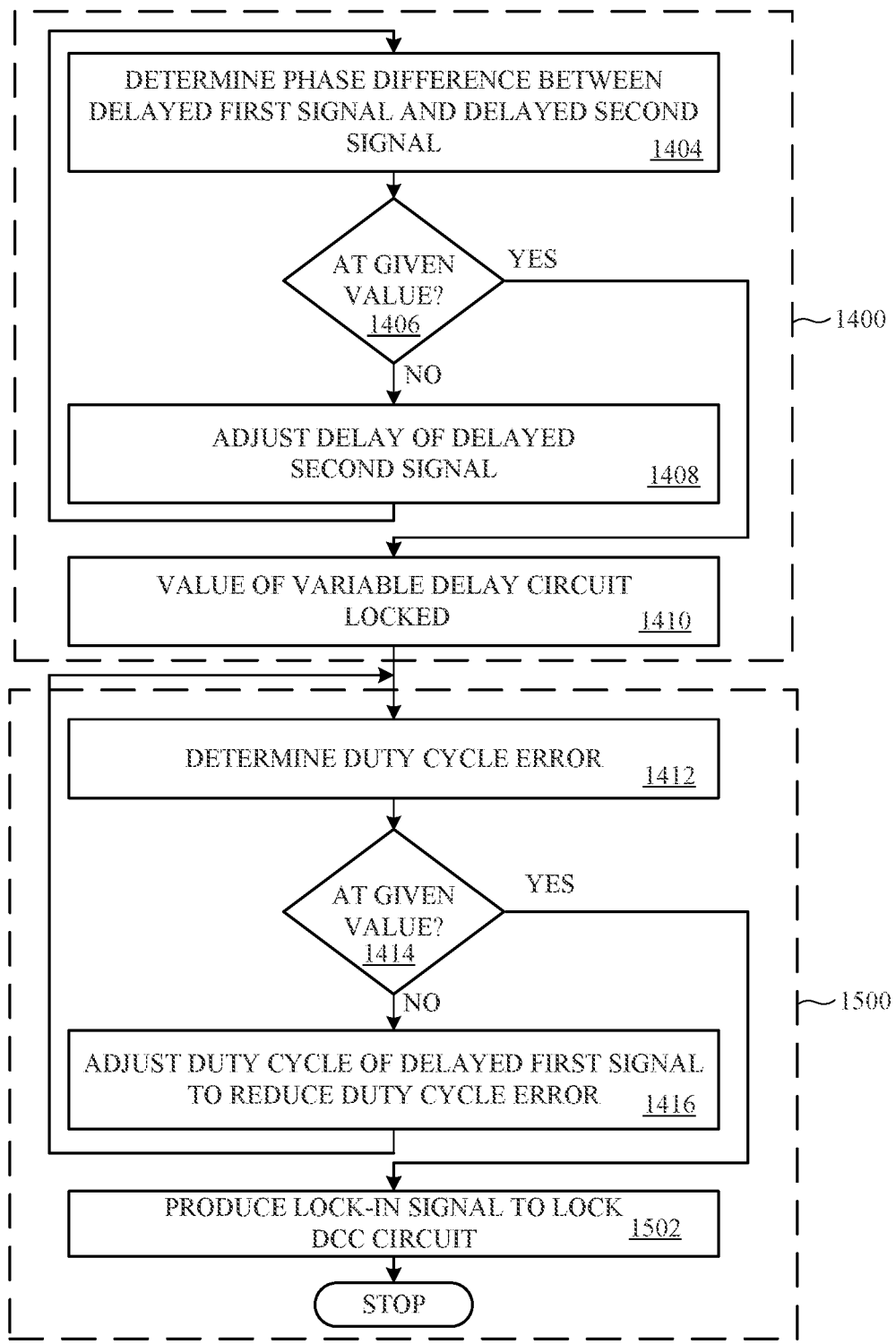
FIG. 15 illustrates a flowchart of a method of operating the duty-cycle corrector circuit shown in FIG. 7 in accordance with some embodiments.

FIG. 15 illustrates a flowchart of a method of operating the DC corrector circuit shown in FIG. 7 in accordance with some embodiments. The method includes many of the blocks shown in FIG. 14. For brevity, the blocks are not described in detail again.

In one embodiment, the phase difference between delayed first signal (the INP signal) and the delayed second signal (the INN_d signal) is reduced to a given value (or reduced to substantially the given value) at block 1400. For example, the phase difference is reduced to zero, or substantially zero at block 1400. At block 1500, the duty cycles of the delayed first signal (the INP signal) and the delayed second signal (the INN_d signal) are adjusted to a given value, or to substantially the given value (e.g., fifty or substantially fifty percent).

Block 1500 begins at block 1412 where a duty-cycle error between the delayed first signal (the INP signal) and the delayed second signal (the INN_d signal) is determined. A determination is made at block 1414 as to whether the duty-cycle error equals, or substantially equals, a given value (e.g., zero). When a determination is made that the duty-cycle error is greater than the given value, the method continues at block 1416 where the duty cycles of the delayed first signal and the delayed second signal are adjusted to reduce the duty-cycle error and the method returns to block 1412. In one embodiment, the duty cycle of the delayed first signal (the INP signal) is adjusted, which results in the adjustment of the duty cycle of the second delayed signal (the INN_d signal). When a determination is made at block 1414 that the duty-cycle error equals, or substantially equals, the given value, a lock-in signal is produced at block 1502. The lock-in signal locks the DCC circuit 702, which causes the value of the DUTY ctrl signal to remain constant. Since the DC circuit 704 in FIG. 7 outputs a digital code signal, the output has a fixed duty cycle. Accordingly, the method ends after the lock-in signal is generated.

Aspects of the embodiments disclosed herein are described with reference to block diagrams and/or operational illustrations of methods and systems. However, embodiments are not limited to the operational flowcharts shown in FIGS. 14 and 15. In other embodiments, the operations noted in the blocks of FIGS. 14 and 15 may occur out of the illustrated order. For example, two blocks shown in succession may in fact be executed substantially concurrently or the blocks may sometimes be executed in the reverse order, depending upon the functionality/acts involved.

In one aspect, a duty-cycle (DC) corrector circuit includes a delay-locked loop (DLL) circuit and a duty-cycle correction (DCC) circuit operably connected to the DLL circuit. The DCC circuit includes a duty adjusting (DA) circuit, a pulse generator circuit operably connected to the DA circuit, and a duty corrector (DC) circuit operably connected to the PG circuit. The DA circuit is operable to receive a clock_in signal and output a delayed first signal. The DA circuit is further operable to adjust a duty cycle of the delayed first signal based on receipt of a duty control signal. The PG circuit is operable to receive the delayed first signal and a delayed second signal and output a first pulse signal and a second pulse signal. The DC circuit is operable to receive the first pulse signal and the second pulse signal from the PG circuit and, based on signal levels of the first and the second pulse signals, output a duty control signal that is received by the DA circuit and used to adjust the duty cycle of the delayed first signal. The DLL circuit includes a phase detector (PD) circuit, an inverter circuit, and a variable delay circuit operably connected between the PD circuit and the inverter circuit. The PD circuit is operable to receive the delayed first signal and the delayed second signal and to detect a phase difference between the delayed first and the second signals. The inverter circuit is operable to receive the delayed first signal and output a second signal. The variable delay circuit is operable to adjust a delay of the second signal to produce the delayed second signal. The adjustment of the delay of the second signal adjusts a delay between the delayed first signal and the delayed second signal.

In another aspect, an electronic device includes a duty-cycle (DC) corrector circuit. In a non-limiting nonexclusive example, the DC corrector circuit includes a delay-locked loop (DLL) circuit and a duty-cycle correction (DCC) circuit operably connected to the DLL circuit. The DCC circuit includes a duty adjusting (DA) circuit, a pulse generator circuit operably connected to the DA circuit, and a duty corrector (DC) circuit operably connected to the PG circuit. The DA circuit is operable to receive a clock_in signal and output a delayed first signal. The DA circuit is further operable to adjust a duty cycle of the delayed first signal based on receipt of a duty control signal. The PG circuit is operable to receive the delayed first signal and a delayed second signal and output a first pulse signal and a second pulse signal. The DC circuit is operable to receive the first pulse signal and the second pulse signal from the PG circuit and, based on signal levels of the first and the second pulse signals, output a duty control signal that is received by the DA circuit and used to adjust the duty cycle of the delayed first signal. The DLL circuit includes a phase detector (PD) circuit, an inverter circuit, and a variable delay circuit operably connected between the PD circuit and the inverter circuit. The PD circuit is operable to receive the delayed first signal and the delayed second signal and to detect a phase difference between the delayed first and the second signals. The inverter circuit is operable to receive the delayed first signal and output a second signal. The variable delay circuit is operable to adjust a delay of the second signal to produce the delayed second signal. The adjustment of the delay of the second signal adjusts a delay between the delayed first signal and the delayed second signal.

In yet another aspect, a method includes receiving a clock_in signal and producing a delayed clock_in signal. The delayed clock_in signal is a delayed first signal. The delayed first signal is inverted to produce a second signal. The second signal is delayed to produce a delayed second signal. A phase difference between the delayed first signal and the delayed second signal is adjusted to reduce the phase difference between the delayed first and the delayed second signals until the phase difference equals or substantially equals a first given value. In one embodiment, the first given value is zero. The method further includes adjusting a first duty cycle of the delayed first signal and a second duty cycle of the delayed second signal until the first and the second duty cycles equal or substantially equal a second given value (e.g., fifty percent). The phase difference is reduced using a delay-locked loop circuit and the first and the second duty cycles are adjusted using a duty-cycle correction circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A duty-cycle (DC) corrector circuit, comprising:
a delay-locked loop (DLL) circuit; and
a duty-cycle correction (DCC) circuit operably connected to the DLL circuit, wherein:
the DCC circuit comprises:
 a duty adjusting (DA) circuit operable to receive a clock_in signal and output a delayed first signal, the DA circuit further operable to adjust a duty cycle of the delayed first signal based on receipt of a duty control signal;
 a pulse generator (PG) circuit operably connected to the DA circuit, the PG circuit operable to receive the delayed first signal and a delayed second signal and output a first pulse signal and a second pulse signal; and
 a duty corrector (DC) circuit operably connected to the PG circuit, the DC circuit operable to receive the first pulse signal and the second pulse signal from the PG circuit and, based on signal levels of the first and the second pulse signals, output a duty control signal that is received by the DA circuit and used to adjust the duty cycle of the delayed first signal; and
the DLL circuit comprises:
 a phase detector (PD) circuit operable to receive the delayed first signal and the delayed second signal and to detect a phase difference between the delayed first and the second signals;
 an inverter circuit operable to receive the delayed first signal and output a second signal; and
 a variable delay circuit operably connected between the PD circuit and the inverter circuit, the variable delay circuit operable to adjust a delay of the second signal to produce the delayed second signal, the adjustment of the delay of the second signal adjusting a delay between the delayed first signal and the delayed second signal.

2. The DC corrector circuit of claim 1, wherein the DLL circuit comprises:
a charge pump (CP) circuit operably connected to the PD circuit; and
a low-pass filter (LPF) circuit operably connected to the CP circuit and operable to output a delay control signal that is used to adjust the delay of the second signal, wherein the variable delay circuit is operably connected to the LPF circuit to receive the delay control signal.

3. The DC corrector circuit of claim 1, wherein the DA circuit comprises:
a first transistor operably connected between a voltage source and a first node;
a second transistor operably connected between the first node and a second node;
a third transistor operably connected between the second node and a third node; and
a fourth transistor operably connected between the third node and a reference voltage source, wherein:
 the duty control signal is received at a gate of the first transistor and at a gate of the fourth transistor; and
 the clock_in signal is received at a gate of the second transistor and at a gate of the third transistor.

4. The DC corrector circuit of claim 3, wherein:
the first and the second transistors are p-type transistors; and
the third and the fourth transistors are n-type transistors.

5. The DC corrector circuit of claim 1, wherein the DA circuit comprises:
a first block of transistors operably connected between a first voltage source and a first node, wherein the first block of transistors comprises one or more first transistors operably connected in parallel;
a second transistor operably connected between the first node and a second node;
a third transistor operably connected between the second node and a third node; and
a second block of transistors operably connected between the third node and a second voltage source, wherein the second block of transistors comprises one or more fourth transistors operably connected in parallel.

6. The DC corrector circuit of claim 5, wherein:
each first transistor and the second transistor are p-type transistors; and
the third transistor and each fourth transistor are n-type transistors.

7. The DC corrector circuit of claim 1, wherein the DC circuit comprises:
a first charge pump operably connected between a voltage source and a node;
a second charge pump circuit operably connected between the node and a reference voltage source; and
a low-pass filter operably connected to the node.

8. An electronic device, comprising:
a duty-cycle (DC) corrector circuit comprising:
a delay-locked loop (DLL) circuit; and
a duty-cycle correction (DCC) circuit operably connected to the DLL circuit, wherein:
the DCC circuit comprises:
a duty adjusting (DA) circuit operable to receive a clock_in signal and output a delayed first signal, the DA circuit further operable to adjust a duty cycle of the delayed first signal based on receipt of a duty control signal;
a pulse generator (PG) circuit operably connected to the DA circuit, the PG circuit operable to receive the delayed first signal and a delayed second signal and output a first pulse signal and a second pulse signal; and
a duty corrector (DC) circuit operably connected to the PG circuit, the DC circuit operable to receive the first pulse signal and the second pulse signal from the PG circuit and, based on signal levels of the first and the second pulse signals, output a duty control signal that is received by the DA circuit and used to adjust the duty cycle of the delayed first signal; and
the DLL circuit comprises:
a phase detector circuit operable to receive the delayed first signal and the delayed second signal and to detect a phase difference between the delayed first and the second signals;
an inverter circuit operable to receive the delayed first signal and output a second signal; and
a variable delay circuit operably connected between the phase detector circuit and the inverter circuit, the variable delay circuit operable to adjust a delay of the second signal to produce the delayed second signal, the adjustment of the delay of the second signal adjusting a delay between the delayed first signal and the delayed second signal.

9. The electronic device of claim 8, wherein the device is a processing device and the DCC circuit is implemented in a deskew circuit in the processing device.

10. The electronic device of claim 8, wherein the DLL circuit comprises:
a charge pump (CP) circuit operably connected to the PD circuit; and
a low-pass filter (LPF) circuit operably connected to the CP circuit and operable to output a delay control signal that is used to adjust the delay of the second signal, wherein the variable delay circuit is operably connected to the LPF circuit to receive the delay control signal.

11. The electronic device of claim 10, wherein the PG circuit comprises:
a first NAND gate;
a second NAND gate;
a first inverter circuit operably connected to an input of the second NAND gate; and
a second inverter circuit operably connected to an input of the first NAND gate.

12. The electronic device of claim 8, wherein the DA circuit comprises:
a first transistor operably connected between a voltage source and a first node;
a second transistor operably connected between the first node and a second node;
a third transistor operably connected between the second node and a third node; and
a fourth transistor operably connected between the third node and a reference voltage source, wherein:
the duty control signal is received at a gate of the first transistor and at a gate of the fourth transistor; and
the clock_in signal is received at a gate of the second transistor and at a gate of the third transistor.

13. The electronic device of claim 12, wherein:
the first and the second transistors are p-type transistors; and
the third and the fourth transistors are n-type transistors.

14. The electronic device of claim 8, wherein the DC circuit is an up/down counter and the duty control signal is an up and down code.

15. The electronic device of claim 14, wherein the DA circuit comprises:
a first block of transistors operably connected between a first voltage source and a first node, wherein the first block of transistors comprises one or more first transistors operably connected in parallel;
a second transistor operably connected between the first node and a second node;
a third transistor operably connected between the second node and a third node; and
a second block of transistors operably connected between the third node and a second voltage source, wherein the second block of transistors comprises one or more fourth transistors operably connected in parallel.

16. The electronic device of claim 15, wherein:
each first transistor and the second transistor are p-type transistors; and
the third transistor and each fourth transistor are n-type transistors.

17. The electronic device of claim 8, wherein the DC circuit comprises:
a first charge pump operably connected between a voltage source and a node;
a second charge pump circuit operably connected between the node and a reference voltage source; and
a low-pass filter operably connected to the node.

18. A method comprising:
receiving a clock_in signal;
producing a delayed clock_in signal as a delayed first signal;
inverting the delayed first signal to produce a second signal;
adjusting a delay of the second signal to produce a delayed second signal, wherein adjusting the delay reduces a phase difference between the delayed first signal and the delayed second signal and the delay is adjusted until the phase difference equals or substantially equals a first given value; and
adjusting a first duty cycle of the delayed first signal and a second duty cycle of the delayed second signal until the first and the second duty cycles equal or substantially equal a second given value.

19. The method of claim 18, wherein:
the first given value is zero; and
adjusting the delay of the second signal until the phase difference between the delayed first signal and the delayed second signal comprises:
  determining the phase difference between the delayed first signal and the delayed second signal;
  based on a determination that the phase difference is greater than zero, adjusting the delay of the delayed second signal; and
  repeating the determining of the phase difference and the adjusting of the delay until the phase difference equals or substantially equals zero.

20. The method of claim 18, wherein:
the second given value is fifty percent; and
adjusting the first duty cycle of the delayed first signal and the second duty cycle of the delayed second signal until the first and the second duty cycles are fifty percent comprises:
  determining a duty-cycle error between the first and the second duty cycles of the delayed first signal and the delayed second signal;
  based on a determination that the duty-cycle error is greater than zero, adjusting the first duty cycle of the delayed first signal and the second duty cycle of the delayed second signal; and
  repeating the determining of the duty-cycle error and the adjusting of the first and the second duty cycles until the first and the second duty cycles of the delayed first and the delayed second signals equal or substantially equal fifty percent.

* * * * *